(12) United States Patent
Drost et al.

(10) Patent No.: US 8,166,644 B2
(45) Date of Patent: May 1, 2012

(54) METHOD FOR MANUFACTURING AN ACTIVE SOCKET FOR FACILITATING PROXIMITY COMMUNICATION

(75) Inventors: Robert J. Drost, Mountain View, CA (US); Gary R. Lauterbach, Los Altos Hills, CA (US); Danny Cohen, Pacific Palisades, CA (US)

(73) Assignee: Oracle America, Inc., Redwood Shores, CA (US)

( * ) Notice: Subject to any disclaimer, the term of this patent is extended or adjusted under 35 U.S.C. 154(b) by 332 days.

(21) Appl. No.: 12/498,282

(22) Filed: Jul. 6, 2009

(65) Prior Publication Data

US 2009/0269884 A1    Oct. 29, 2009

Related U.S. Application Data

(62) Division of application No. 11/154,392, filed on Jun. 15, 2005, now Pat. No. 7,573,720.

(51) Int. Cl.
*H05K 3/30* (2006.01)
(52) U.S. Cl. ............... 29/834; 29/854; 438/108
(58) Field of Classification Search ............ 29/832, 29/834, 854; 257/532, 664, 723; 438/108
See application file for complete search history.

(56) References Cited

U.S. PATENT DOCUMENTS

| | | | |
|---|---|---|---|
| 5,629,838 A | 5/1997 | Knight | |
| 6,121,676 A * | 9/2000 | Solberg | 438/108 |
| 6,307,769 B1 | 10/2001 | Nuxoll | |
| 6,310,400 B1 * | 10/2001 | Doyle et al. | 257/532 |
| 6,490,188 B2 | 12/2002 | Nuxoll | |
| 6,721,920 B2 | 4/2004 | Rearick | |
| 6,728,113 B1 | 4/2004 | Knight | |
| 6,916,719 B1 | 7/2005 | Knight | |
| 2001/0022740 A1 | 9/2001 | Nuxoll | |
| 2002/0188901 A1 | 12/2002 | Rearick | |
| 2004/0145063 A1 | 7/2004 | Sutherland | |

* cited by examiner

*Primary Examiner* — Donghai D. Nguyen
(74) *Attorney, Agent, or Firm* — Park, Vaughan, Fleming & Dowler LLP; Anthony Jones (57) ABSTRACT

One embodiment of the present invention provides a system that facilitates capacitive communication between integrated circuit chips. The system includes a substrate having an active face upon which active circuitry and signal pads reside, and a back face opposite the active face. The system additionally includes an integrated circuit chip having an active face upon which active circuitry and signal pads reside, and a back face opposite the active face. Additionally, the integrated circuit chip is pressed against the substrate such that the active face of the integrated circuit chip is parallel to and adjacent to the active face of the substrate, and capacitive signal pads on the active face of the integrated circuit chip overlap signal pads on the active face of the substrate. The arrangement of the substrate and integrated circuit chip facilitates communication between the integrated circuit chip and the substrate through capacitive coupling via the overlapping signal pads.

3 Claims, 8 Drawing Sheets

METHOD FOR MANUFACTURING AN ACTIVE SOCKET FOR FACILITATING PROXIMITY COMMUNICATION

RELATED APPLICATIONS

This application is a divisional application of, and hereby claims priority under 35 U.S.C. §120 application Ser. No. 11/154,392, to U.S. Pat. No. 7,573,720, filed 15 Jun. 2005, entitled "Active Socket for Facilitating Proximity Communication".

BACKGROUND

The present invention relates to the design of a socket structure that facilitates proximity communication between IC chips.

Advances in semiconductor technology presently make it possible to integrate large-scale systems, including tens of millions of transistors, into a single semiconductor chip. Integrating such large-scale systems onto a single semiconductor chip increases the speed at which such systems can operate, because signals between system components do not have to cross chip boundaries, and are not subject to lengthy chip-to-chip propagation delays. Moreover, integrating large-scale systems onto a single semiconductor chip significantly reduces production costs, because fewer semiconductor chips are required to perform a given computational task.

Unfortunately, these advances in semiconductor technology have not been matched by corresponding advances in inter-chip communication technology. Semiconductor chips are typically integrated onto a printed circuit board that contains multiple layers of signal lines for inter-chip communication. However, signal lines on a semiconductor chip are about 100 times more densely packed than signal lines on a printed circuit board. Consequently, only a tiny fraction of the signal lines on a semiconductor chip can be routed across the printed circuit board to other chips. This problem is beginning to create a bottleneck that continues to grow as semiconductor integration densities continue to increase.

Researchers have begun to investigate alternative techniques for communicating between semiconductor chips. One promising technique (which is referred to as "proximity communication") involves integrating arrays of capacitive transmitters and receivers onto semiconductor chips to facilitate inter-chip communication. If a first chip is situated face-to-face with a second chip so that transmitter pads on the first chip are capacitively coupled with receiver pads on the second chip, it becomes possible to transmit signals directly from the first chip to the second chip without having to route the signal through intervening signal lines within a printed circuit board.

However, it is not a simple matter to align the chips properly for proximity communication. It is also a considerable challenge to provide power to the chips and to remove heat from the chips.

Hence, what is needed is an apparatus for facilitating mechanical alignment of chips in a socket that facilitates proximity communication without the problems described above.

SUMMARY

One embodiment of the present invention provides a system that facilitates capacitive communication between integrated circuit chips. The system includes a substrate having an active face upon which active circuitry and signal pads reside, and a back face opposite the active face. The system additionally includes an integrated circuit chip having an active face upon which active circuitry and signal pads reside, and a back face opposite the active face. Additionally, the integrated circuit chip is pressed against the substrate such that the active face of the integrated circuit chip is parallel to and adjacent to the active face of the substrate, and capacitive signal pads on the active face of the integrated circuit chip overlap signal pads on the active face of the substrate. The arrangement of the substrate and integrated circuit chip facilitates communication between the integrated circuit chip and the substrate through capacitive coupling via the overlapping signal pads.

In a variation on this embodiment, the system includes a second integrated circuit chip having an active face upon which active circuitry and signal pads reside, and a back face opposite the active face. Additionally, the second integrated circuit chip is pressed against the substrate such that the active face of the second integrated circuit chip is parallel to and adjacent to the active face of the substrate, and capacitive signal pads on the active face of the second integrated circuit chip overlap signal pads on the active face of the substrate. The arrangement of the substrate and integrated circuit chip facilitates communication between the second integrated circuit chip and the substrate through capacitive coupling via the overlapping signal pads.

In a further variation, a signal pad on the active face of the substrate overlaps a signal pad on the active face of the integrated circuit chip and also a signal pad on the active face of the second integrated circuit chip. This arrangement enables the integrated circuit chip to communicate with the second integrated circuit chip.

In a further variation, a signal pad on the active face of the substrate is electrically coupled to a non-adjacent signal pad on the active face of the substrate. Additionally, the non-adjacent signal pad overlaps a signal pad on the active face of a third integrated circuit chip that is non-adjacent to the first integrated circuit chip. This arrangement enables the integrated circuit chip to communicate with the third integrated circuit chip.

In a variation on this embodiment, the substrate includes a recessed cavity which is shaped so that the integrated circuit chip fits into the recessed cavity. Placing the integrated circuit chip into the cavity facilitates alignment in a plane parallel to the surface of the substrate, eliminating alignment errors on the X, Y, and θ axis.

In a variation on this embodiment, the substrate includes posts on the active side of the substrate configured so that the integrated circuit chip fits into a cavity defined by the posts. Placing the integrated circuit chip into the cavity defined by the posts facilitates alignment in a plane parallel to the surface of the substrate, eliminating alignment errors on the X, Y, and θ axis.

In a variation on this embodiment, the substrate includes posts on the active side of the substrate configured so that the posts define two sides of a cavity on the active side of the substrate. The substrate additionally includes MEMS springs on the active side of the substrate that press the integrated circuit chip into the cavity defined by the posts. Placing the integrated circuit chip into the cavity defined by the posts and MEMS springs facilitates alignment in a plane parallel to the surface of the substrate, eliminating alignment errors on the X, Y, and θ axis.

In a variation on this embodiment, the processor and the memory are comprised of integrated circuit chips that are pressed against the substrate.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
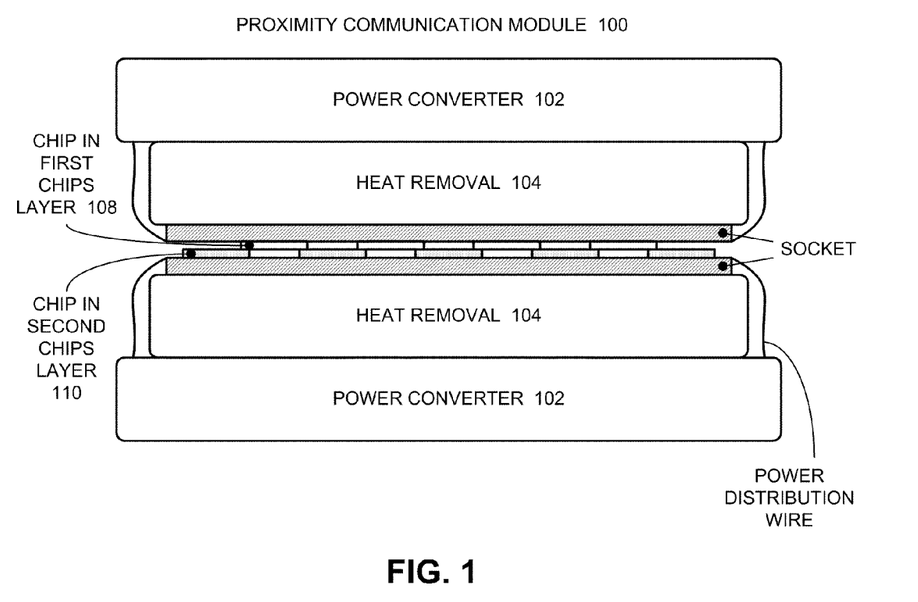
FIG. 1 illustrates a side view of a symmetric proximity communication module in accordance with an embodiment of the present invention.

FIG. 1 illustrates a side view of a symmetric proximity communication module in accordance with an embodiment of the present invention. The depicted proximity communications module 100 comprises a nearly symmetric structure of chips 108 and 110, power supply conversion 102 mechanisms, and delivery and heat removal 104 mechanisms on both halves of the module. For operation, the two halves of the socket structure are sandwiched together, placing the chips 108 and 110 in a face-to-face alignment for proximity communication.

However, the symmetric proximity communications module 100 structure illustrated in FIG. 1 does impose some limitations. For instance, the power conversion 102 and heat removal 104 mechanisms would both ideally be situated as close as possible to the chips 108 and 110. In existing socket designs, the heat removal 104 mechanism is placed near the chips 108 and 110, and the power units 102 are place either outboard, or behind the heat removal 104 mechanism.

Figure 2:
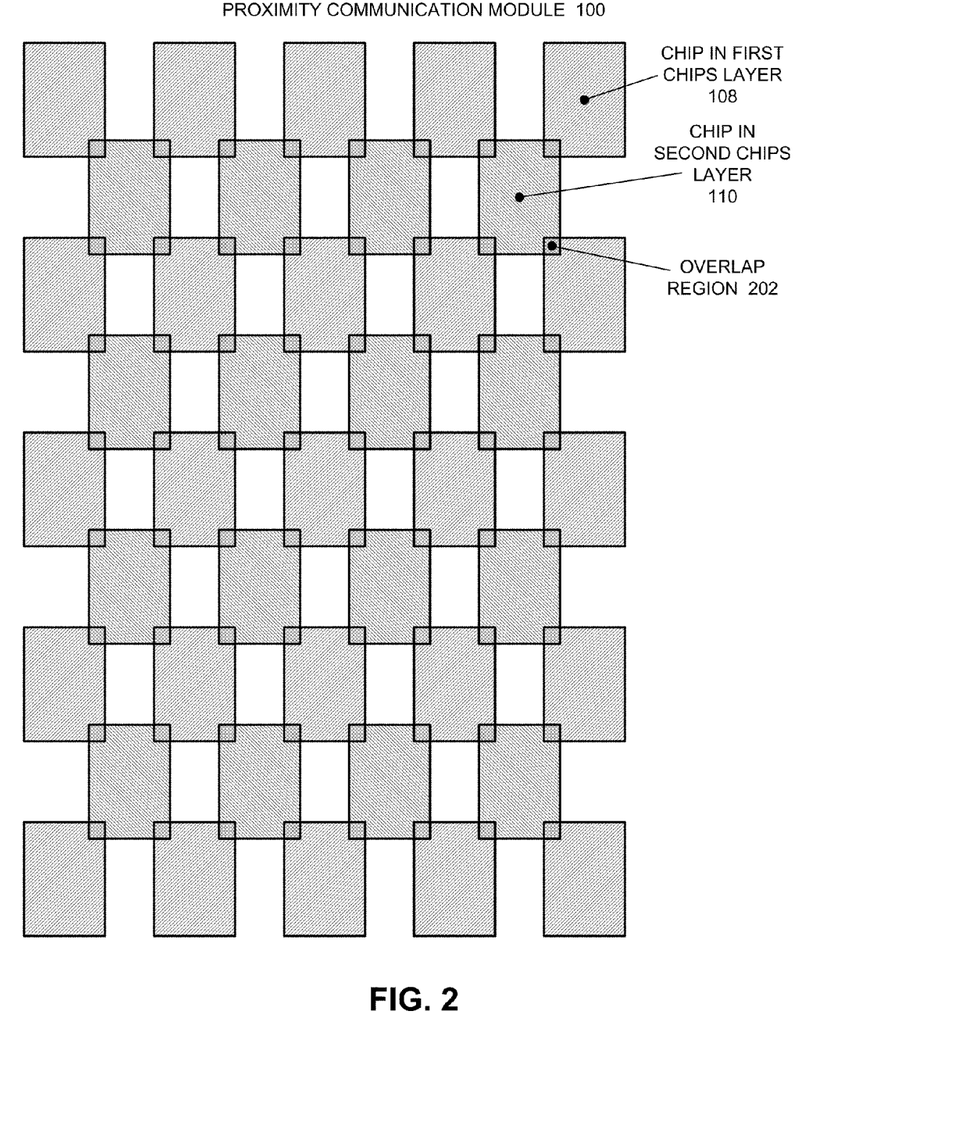
FIG. 2 illustrates a top view of checkerboard chip tiling in a symmetric proximity communication module in accordance with an embodiment of the present invention.

FIG. 2 illustrates a top view of a chip arrangement for the proximity communications module 100 illustrated in FIG. 1. FIG. 2 illustrates that the proximity communications module 100 positions the two layers of chips 108 and 110 in a checkerboard arrangement. The two layers of chips 108 and 110 face each other so that the active side of the chips, the side containing transistors in wires, face one another. The two layers of chips 108 and 110 overlap at their corners creating overlap region 202. In overlap region 202, proximity communication circuits and structures enable high bandwidth chip-to-chip communication.

Achieving sufficient mechanical alignment between the two socket halves may be difficult. Planar mechanical misalignment can be corrected by on-chip electronic alignment structures, however the gap between chips cannot (R. Drost, R. Ho, D. Hopkins, & I. Sutherland, "Electronic Alignment for Proximity Communication," IEEE Int'l Solid-State Circuits Conference Digest of Papers, Febuary 2004). Thus controlling the gap between chips is a critical concern.

Figure 3:
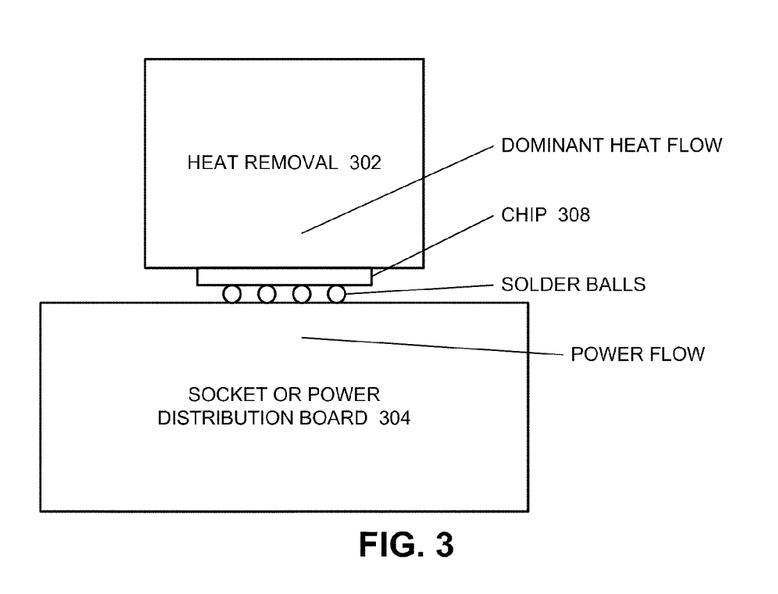
FIG. 3 illustrates power and dominant heat flow vectors into and out of a chip in accordance with an embodiment of the present invention.

As mentioned above, power conversion and heat removal should both be as close to the chips as possible for highest performance. FIG. 3 illustrates a simple view of the flow of power into and heat out of a single chip. In FIG. 3, heat removal mechanism 302 should be close to the chips 308 to minimize the thermal resistance of the heat removal mechanism 302. Thermal resistance relates the rise in chip temperature as a function of the power consumption of the chip 308 by the equation:

ChipTemperature=ThermalResistance*HeatGeneration+ EnvironmentTemperature

Figure 4:
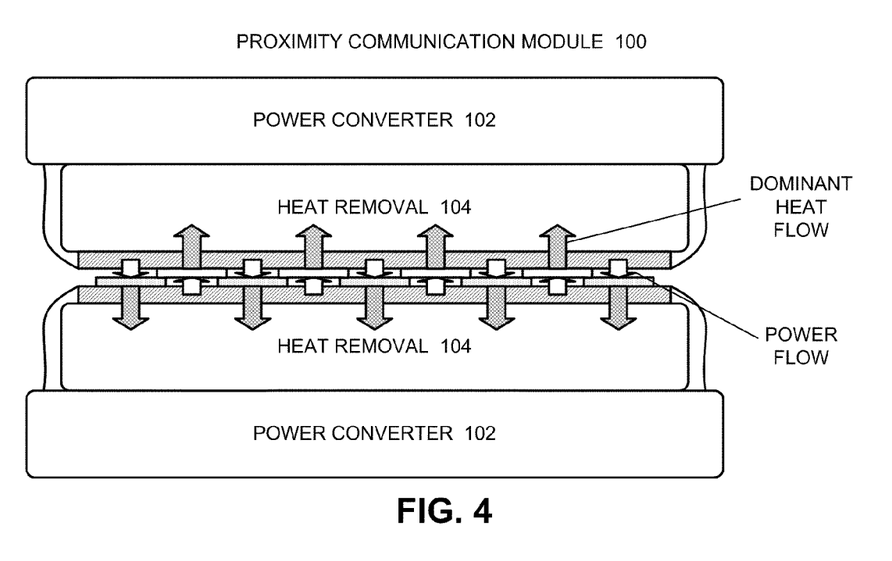
FIG. 4 illustrates a side view of a symmetric proximity communication module with power and dominant heat flows in accordance with an embodiment of the present invention.

Excessive temperature rise may cause a chip 308 to malfunction or deliver lower performance. Power conversion should be located close to the chip 308 to minimize the impedance of the power distribution from the power supply 304 to the chips 308. The impedance of the power delivery network causes the chip supply voltage to fluctuate as function of the current drawn by the chip 308. Chip 308 supply voltage fluctuations may cause malfunctions or poor performance. FIG. 4 illustrates a side view of a symmetric proximity communication module 100 with power and dominant heat flows.

Figure 5:
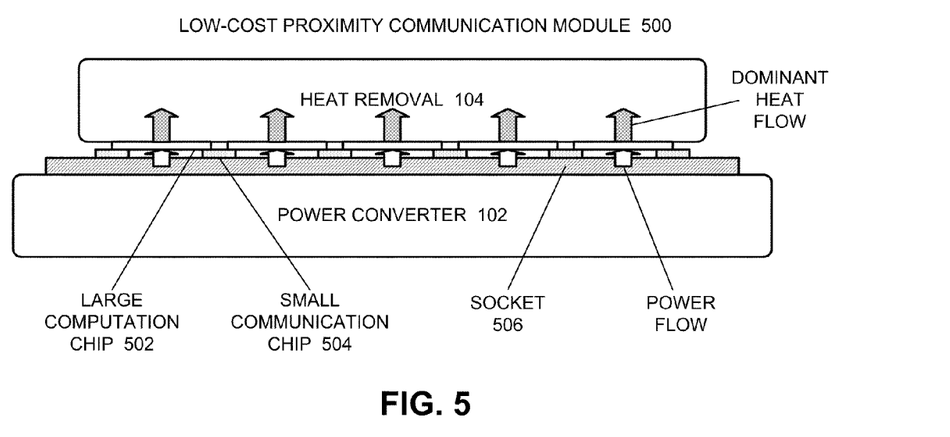
FIG. 5 illustrates a low-cost proximity communication module with main power and heat flows in accordance with an embodiment of the present invention.

A cost-reduced version of the socket provides an asymmetric chip stack-up (see FIG. 5). Large computer chips 502 face the socket 506 and small communication chips 504 face away from the socket 502. Hence, the large chips 502 and the small chips 504 face each other and communicate using proximity communication along the edges or corners of the large chips 502 and the small chips 504. Note that FIG. 5 omits the mechanisms that couple power from the socket 506 to the small chips 504 and the large chips 502. The power and dominant heat flows for the large chips 502 are shown, but are omitted from the small chips 504. The aim in this implementation is to reduce the power consumption of the small chips 504 enough so that they are relatively easy to power and cool. For instance, if the small chips 504 consume trivial amounts of power, then wirebonds can conduct power from the socket 506 to the active face of the small chips 504, and the heat can easy dissipate by a number of mechanisms. Note that heat may: radiate to the opposing heat removal mechanism 104; may conduct through the proximity communication overlap regions into the large chips 502; or may conduct back into the power conversion unit 102 and be dealt along with heat generated due to inefficiencies in the power conversion unit 102.

Although the power and cooling flows have been simplified and are largely uni-directional, this cost-reduced implementation still involves the complexity of placing both large chips 502 and small chips 504. Placing the small chips 504 and the large chips 502 is difficult because proximity communication requires tight mechanical alignment tolerances in order to achieve high performance. The array of chips must be coplanar at the overlap regions or a gap will form between the transmit and receive structures for some of the proximity communication regions. Eliminating the gap between chip surfaces is difficult. By eliminating the gap at the face-to-face interface, all of the chips' active surfaces will line up to a single plane. If the socket 506 supports the backside of chips with a solid planar backing surface, then it may still not be possible to line up the chip surface on a single plane because of variations in chip thicknesses, even if the socket 506 has perfect mechanical dimensions. For example, consider the checkerboard arrangement of chips shown in FIG. 2. In this chip arrangement, overlapping regions 202 contain proximity communication regions. In this arrangement, each chip contacts four opposing chips. Chip thickness variation will cause gaps between chips if solid planar backing structures push the chips together. In other words, a chip will wobble if the opposing four chips are non-uniform thickness. This is similar to how a three-legged bar stool will be stable, but a four-legged table can wobble. Three points always define a plane; however, four points do not except in the particular case of four co-planar points. Mechanical flexibility in the backing structure would ease this problem, but not solve it entirely.

Proximity Communication Module with Active Socket

Figure 6:
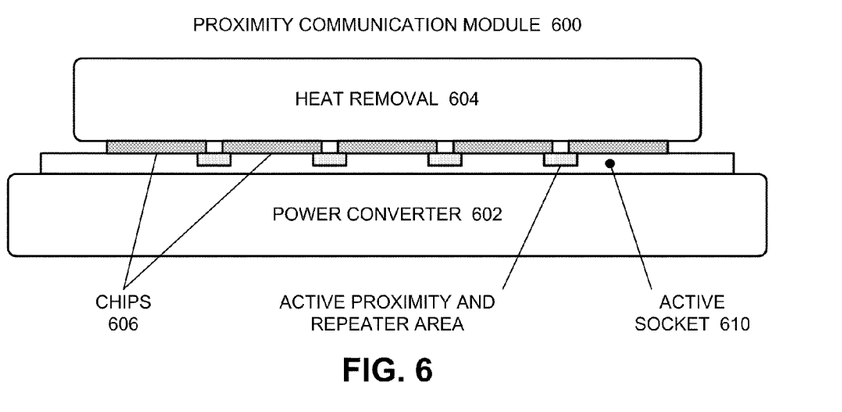
FIG. 6 illustrates a side view of a proximity communication module with an active socket in accordance with an embodiment of the present invention.

FIG. 6 illustrates a side view cross-section of a proximity communication module 600 with an active socket 610 in accordance with an embodiment of the present invention. Proximity communication module 600 uses a new active silicon socket structure 610 to achieve superior power generation and distribution, mechanical alignment, manufacturing simplicity, and heat removal. Proximity communication module 600 uses proximity communication to provide the major signal bandwidth for chips 606. Proximity communication module 600 is composed of an asymmetric stack of components.

Proximity communication module 600 is similar to the low-cost module (illustrated in FIG. 5) in its placement of power converter 602 and heat removal 604 units, but has a different configuration of chips 606 and socket 610. Rather than using two layers of chips that connect using proximity communication, the present embodiment uses communication circuits that are fabricated as part of active socket 610.

Chips 606 communicate with the active socket 610 substrate using proximity communication. Proximity communication leverages the fact that adjacent circuits may couple without using external wires. Instead, on-chip wires on overlapping circuits may couple capacitively or inductively. Moreover, on-chip wires may be fabricated to be orders of magnitude denser than off-chip wires. Due to the exclusive use of on-chip wires, proximity communication achieves about a hundred-fold improvement in density and bandwidth compared to communication using off-chip wires constructed out of area ball bonds or wire bonds.

Active Socket—Top View

Figure 8:
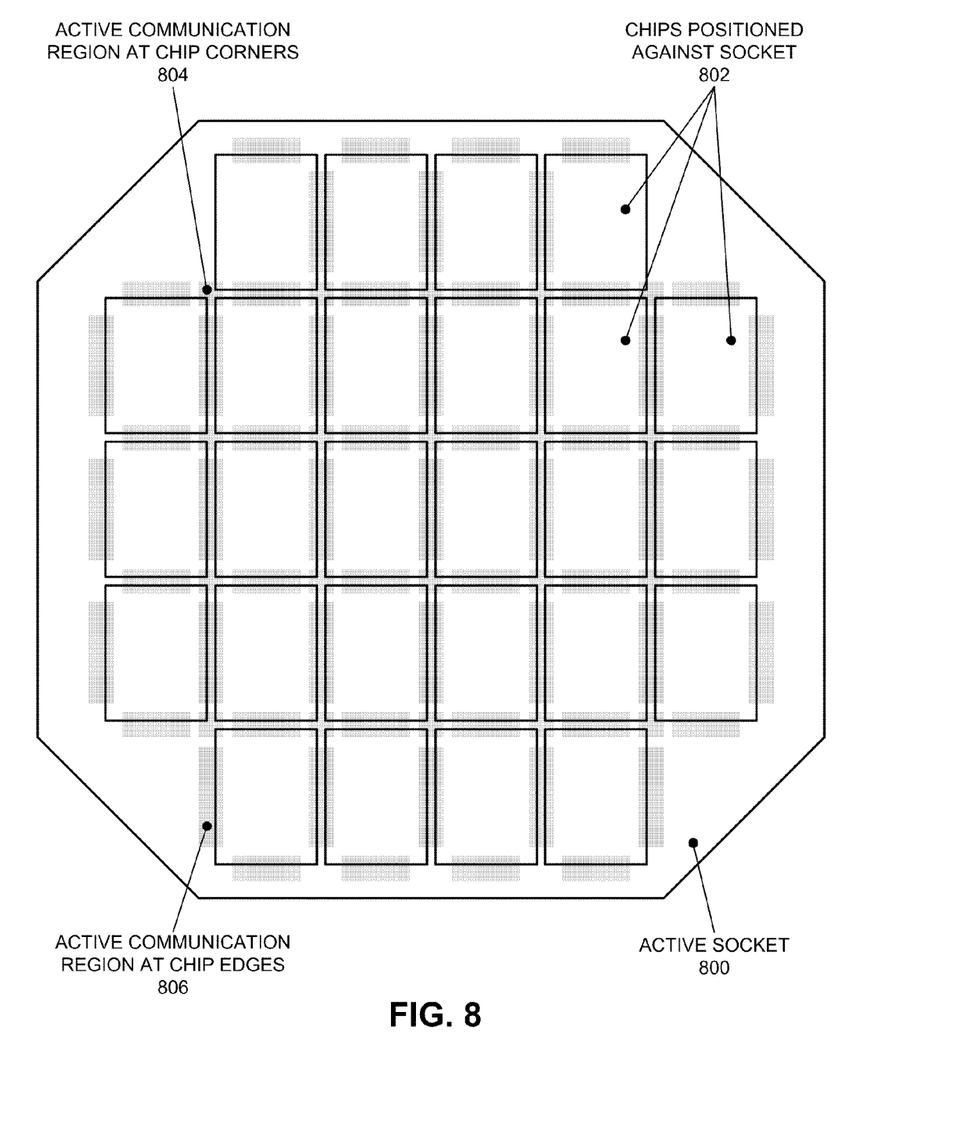
FIG. 8 illustrates a top view of an active socket and chips in accordance with an embodiment of the present invention.

FIG. 8 illustrates a top view of an active socket 800 in accordance with an embodiment of the present invention. Active socket 800 includes an array of chips 802 that use proximity communication to achieve high-bandwidth data transfers with socket 800. The array of chips 802 is positioned against the active socket 800. Communication regions in the active socket are located at the corners 804 among four chips 802, along the edges 806 between chips 802, or at both locations. The communication regions 804 and 806 in the active socket 800 contain proximity communication circuits that transmit data to and receive data from the chips 802. The communication regions 804 and 806 also contain wiring and circuitry to transport data among the proximity communication circuits. In effect, the communication regions 804 and 806 provide high bandwidth conduits among the chips 802 placed against the socket 800.

Figure 7:
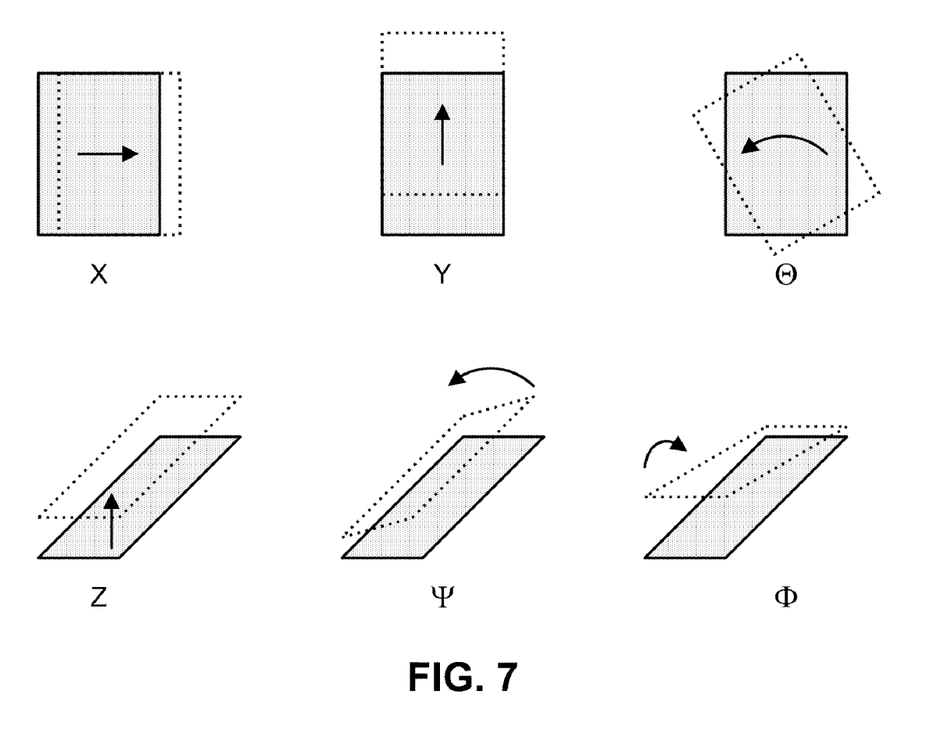
FIG. 7 illustrates the six degrees of mechanical alignment in accordance with an embodiment of the present invention.

The active socket 800 alleviates two problems found in the low-cost socket 506 (illustrated in FIG. 5), namely mechanical alignment and power distribution. First, the mechanical alignment of the small areas of communication circuits will be improved. For example, if the active socket 800 is fabricated out of a silicon wafer, then the manufacturing tolerances of modern integrated circuit fabrication will allow for precise positioning in the X, Y, and θ directions for these circuits. (FIG. 7 illustrates the six degrees of mechanical alignment in accordance with an embodiment of the present invention.) Also, Z alignment will be improved because the communication circuit regions will exists on the planar surface of the silicon wafer. Variations in the thickness of the chips 802 placed in the socket 800 may still cause Z misalignments, but should no longer cause ψ, and φ misalignments. Second, powering the communication circuits in the active regions of the socket 800 is easier than powering the separate small chips 504 in the low-cost proximity communication module 500. Standard silicon metallization interconnect may conduct power into the communication circuit regions. This metallization will already be part of the socket 800 in order to bring power to the power coupling mechanism for the large chips 802.

In addition to improvements compared to past module designs, the active socket 800 provides bandwidth improvements versus a printed wire board that contains no active circuitry. It has been shown that the maximum bandwidth at which data can be communicated using wires or waveguides is limited by the geometric aspects of the gross volume through which the data is communicated (see D. Miller, "Rationale and Challenges for Optical Interconnects to Electronic Chips," Proceedings of the IEEE vol. 88, no. 6, pp. 728-749, June 2000.) Specifically, maximum communication bandwidth is proportional to the cross-sectional area of the volume, and inversely proportional to the square of the length of the volume, Maximum Bandwidth∝Area/Length$^2$. This attenuation in communication bandwidth due to length is caused by resistive and conductive losses of conductors. If the socket 800 is a printed wiring board that contains no active circuitry, then the Length is set by the distance between the driving and receiving chips. However, by making the substrate active, repeaters can be inserted into the substrate and accomplish arbitrarily high maximum bandwidths by reducing the length between repeaters.

The active substrate may be constructed out of silicon, or in other embodiments out of a different material, such as Gallium Arsenide. The socket material must simply permit fabrication of active circuitry within the socket 800. Additionally, for thermal expansion, a substrate that matches the thermal coefficient of expansion of the chips 802 may be considered. Hence, for silicon chips, a silicon socket fabricated out of a wafer using silicon integrated circuit fabrication processes is a reasonable choice. The active socket may have a variety of shapes, square, rectangular, hexagonal, or circular to name a few. For example, if socket 800 is fabricated out of a silicon wafer, then it may be most efficient area-wise to use a circular shape or hexagonal to utilize more of the circular wafer area.

Given this basic description, the following sections discuss issues relating to: power and cooling; manufacturing yield of the active socket 800; connection topology; and aligning the large chips 802 to the active socket 800.

Power Generation, Distribution, and Heat Removal

A power converter unit connects to the bottom of the active silicon socket 800. In one embodiment of the present invention, the power converter produces a DC voltage to supply the chips 802. In this embodiment, there may be a layer of decoupling components sandwiched between the power converter unit and the active silicon socket. Note that any additional decoupling mechanism may be considered to be part of the power generation unit. In this embodiment, the power converter conductively connects to the active silicon socket 800 by a welded metal, such as reflowed solder, or reflowed gold bumps, or it can connect to the silicon socket 800 through a matrix of detachable connections, using springs, wipe contacts, fuzzbuttons, or micro-spring connections (see S. Mick, J. Wilson, P. Franzon, "4 Gbps High-Density AC Coupled Interconnection," Proceedings of the IEEE Custom Integrated Circuits Conference, pp. 133-140, 2002.)

In another embodiment, the power converter outputs an AC voltage to supply chips 802. In this embodiment, the power converter may still conductively connect to the active silicon socket 800, or it may couple electro-magnetically, for example, through capacitive or inductive coupling.

The heat removal mechanism is comparable to the prior modules, but has advantage in that the active regions in the socket 800 dissipate effectively into the surrounding passive portions of the socket 800. Thus, one can remove heat from these active regions using a number of mechanisms individually or in combination. First, heat can be removed by conduction of heat through the proximity regions into the larger chips 802 and then the heat removal mechanism. Second, heat can be removed by conduction of the heat into the power converter unit, which may have a separate heat removal mechanism to remove heat generated by the inefficiencies of power conversion. Third, the active silicon socket 800 could include internal fluidic channels that would circulate a cooling liquid which would remove heat from the active regions. (see E. Verpoorte, N. De Rooij, "Microfluidics Meets MEMS," Proceedings of the IEEE, vol. 91, no. 6, pp. 930-953, June 2003.) Note that the fluidic channels method could also act as the heat removal mechanism for the power converters as well as the chips 802.

To ease the heat removal from the active socket 800's circuit regions, one may strive for low power generation in the active circuit regions. The active silicon socket 800 can be low power because one may avoid including high power functions on active silicon socket 800 and one may minimize the total size and capacitance of structures on the active socket 800. This is consistent with the goal to improve the yield of the active silicon socket 800 by keeping the socket 800 simple and sparse with respect to total area and quantity of circuits. FIG. 8 illustrates that the active socket 800 is relatively sparse with respect to the active communication circuit areas contained within.

Improving Active Socket Yield

One challenge in building the active socket 800 is achieving high socket yield given manufacturing defects. The yield of the active socket 800 can be approved in two ways. First, the yield can be improved through construction that reduces the likelihood that a defect will cause a circuit malfunction or fault, and second, the yield can be approved through redundancy that compensates for circuits that do in fact malfunction due to a manufacturing defect.

Figure 10:
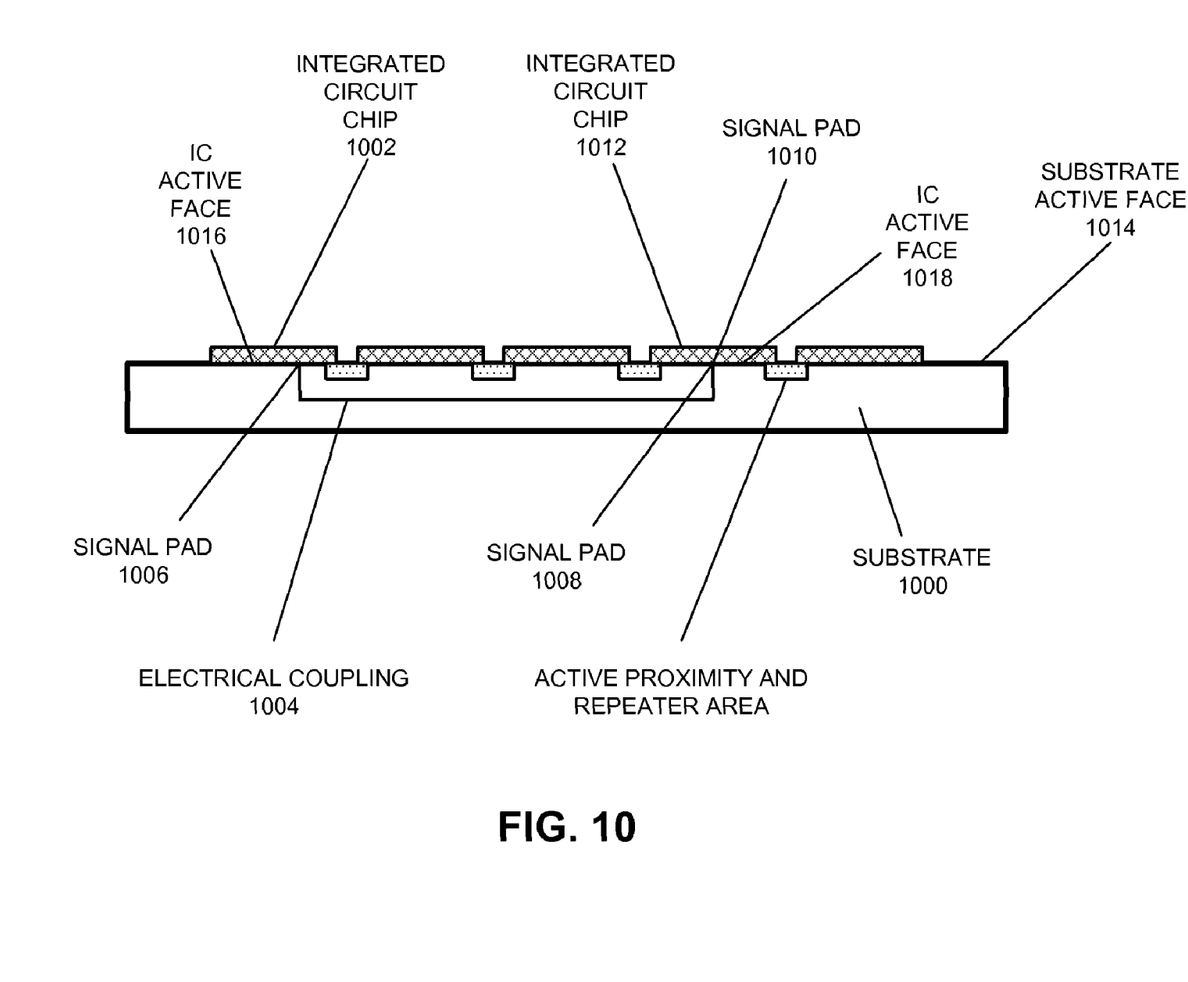
FIG. 10 illustrates an electrical coupling from a signal pad on the active face of the substrate to a non-adjacent signal pad on the active face of the substrate.

First, considering yield improvement by construction, FIG. 8 illustrates that the active socket 800 comprises two distinct areas. In a first "active" area, active circuits built into the socket 800 interact with the overlapping chips 802 using proximity communication and carry data from one chip to another. In a second "non-active" area, the socket 800 simply contains metal wires that carry power through the socket 800 and from the power converter to the power coupling mechanism for the chips 802. The second area may also contain a small number (compared to the active circuit area) of signals to communicate test signals, clocking or timing signals, or narrow data paths. (For example, FIG. 10 illustrates an electrical coupling 1004 from a signal pad 1006 on active face 1014 of substrate 1000 to a non-adjacent signal pad 1008 on active face 1014 of substrate 1000, wherein the non-adjacent signal pad 1008 overlaps a signal pad 1010 on active face 1018 of integrated circuit chip 1012 that is non-adjacent to integrated circuit chip 1002, thereby allowing integrated circuit chip 1002 to communicate with integrated circuit chip 1012). The active area is more sensitive to manufacturing defects because this area contains finely spaced transistors and wires. Typical manufacturing defects in the active area will be large enough to cause wires or transistors to short or open. In the non-active area, wires that conduct power, or the small number of signals, may be sized large enough to be immune to most manufacturing defects. As an example, in silicon wafer processing, defects are typically caused by small dust particles. These dust particles cause fabrication material to be either added or removed in metal layers where the dust fell, causing shorts or opens, respectively. If the typical dust particle and resulting defect have a diameter of $\alpha$ microns, then by sizing wires in the non-active area to have widths and spacings greater than $\alpha$ microns, these wires can be made to be immune to typical defects. The combination of sizing wires in non-active areas to be large enough to have immunity to defects, and minimizing the size of the defect sensitive active area provides yield improvement by construction. For representative values, typical defect diameters, $\alpha$, in modern sub-micron integrated circuit fabrication are on the order of 0.5 to 10 microns.

The power wiring may be sized quite large to reduce R and L, and because of reticle stepping alignment accuracy concerns. The defect immunity afforded by large sizes is an automatic side benefit of this large sizing. Interior to a reticle, alignments are submicron-level for state-of-the-art semiconductor manufacturing. However, the alignment between reticles is not typically important because chips 802 are fully contained in one reticle field. Hence, alignment between reticles is not as well controlled. If the reticle step to step alignment accuracy is Y microns, then one would wish to make the wires that cross reticles have widths, spaces, or pitches that exceed Y microns.

As an example or yield improvement by construction, define the defect "cross-section" area percentage of the active socket 800 to be the area percentage of the socket 800 on which if there was a defect there would be a malfunction or fault. As illustrated in FIG. 8, assuming that, for example, only 2% active area in the socket 800 is used to communicate between adjacent chips 802, and assuming that on average there are 10 defects per wafer, then the average yield of perfect wafers would be $0.98^{10}$, or about 82%. In this example, a perfect wafer means that all defects fell on the 98% inactive area of the socket 800.

In addition to reducing the defect capture "cross-section" of the socket 800 by minimizing the size of the active circuit areas, redundant circuitry can be included in the active areas to permit the repair of many instances of faults. In effect, this reduces the "cross-section" further by requiring two or more faults to occur in areas that can repair one fault, and so on. Socket 800 can be designed to include spare communication paths in the active communication circuits. Path functionality can be checked during calibration times, or during normal operation using parity or error-checking codes. Malfunctioning paths can then be replaced with the excess paths. This is similar to the use of redundant rows, columns, or bits to improve yield in memory chip manufacturing. Additionally, depending on system design and use of the active socket 800 network, the system may tolerate some fraction of non-functioning portion of the socket 800's active circuitry.

Connection Network Between Chips

For power reasons, most the connections on the active silicon substrate are typically between adjacent chips 802. In this way, the power consumed by charging and discharging the wiring capacitance will occur mostly in the chips 802 rather than the socket 800. This is because that power is roughly proportional to the length of the wires. By only supporting adjacent chip communication in the socket 800, the wire lengths are minimized in the socket 800. However, it may be beneficial to provide some connectivity between chips farther removed. This may permit lower latency communication, and may permit a chip to be diagnosed as missing or not working. In some cases, these longer length wires may connect only two chips in a point-to-point arrangement. In other uses, it may be convenient to construct buses rather than point-to-point connections out of wires that span three or more chips.

In this richer connection network one can view the proximity communication as "plugging" the chips into a network, rather than into connections that merely stitch connectivity between adjacent chips.

The network constructed by the combination of the chips 802 and the active circuitry in the socket 800 may be built as one of two extreme cases. In one embodiment of the present invention, the socket 800 network are point-to-point connections with no switching or networking capability, and the chips 802 contain a full network switch. In the second extreme case, the chips 802 could contain no switching capability, but rather act in a terminal capacity, just inserting and extracting information from the socket 800 network, that contains all of the switching or networking capability. Moreover, there are a range of possible network designs between these two extremes.

Mechanical Alignment Structures

Figure 9:
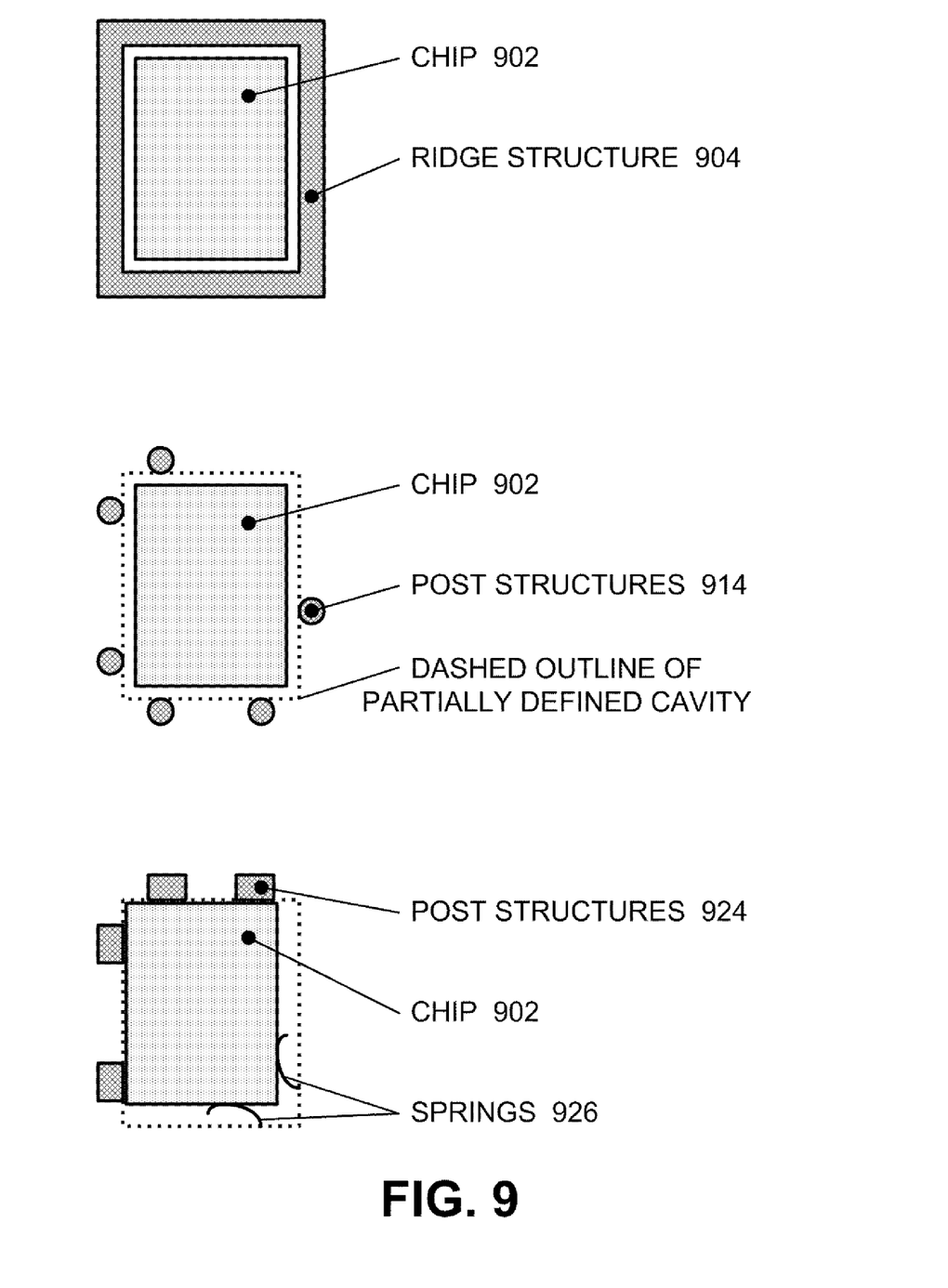
FIG. 9 illustrates mechanical alignment structures in accordance with an embodiment of the present invention.

FIG. 9 illustrates mechanical alignment structures in accordance with an embodiment of the present invention. The active socket 800 can be designed with mechanical structures that aid in mechanically aligning the chips 902 to the active socket 800. As illustrated in FIG. 9, structures including ridge structure 904 or post structures 914 and 924 may be built up on the socket 800 or laminated to the socket 800 using microelectromechanical system (MEMS) fabrication methods. The dashed lines depicting the outline of the partially defined cavity indicate no actually physical structure. Rather, they show the cavity that is defined by the physical ridge structure 904, post structures 914 and 924, and spring structures 926. Recall that FIG. 7 illustrates the six degrees of mechanical movement. The posts or ridges define chip positions, restricting the X, Y, and θ degrees of motion. Additionally MEMS springs can be used to press chips 902 against two edges of the partially defined cavity, rather than allowing the chips 902 to float within the partially defined cavity.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for manufacturing an apparatus for facilitating capacitive communication between integrated circuit chips, the method comprising:
    creating a substrate with an active face upon which active circuitry and signal pads reside, and a back face opposite the active face;
    creating a first integrated circuit chip with an active face upon which active circuitry and signal pads reside, and a back face opposite the active face;
    pressing the first integrated circuit chip against the substrate such that the active face of the first integrated circuit chip is parallel to and adjacent to the active face of the substrate, and capacitive signal pads on the active face of the first integrated circuit chip overlap signal pads on the active face of the substrate; and
    electrically coupling a signal pad on the active face of the substrate to a non-adjacent signal pad on the active face of the substrate, wherein the non-adjacent signal pad overlaps a signal pad on the active face of a third integrated circuit chip that is non-adjacent to the first integrated circuit chip, thereby allowing the first integrated circuit chip to communicate with the third integrated circuit chip.

2. The method of claim 1, further comprising:
    creating a second integrated circuit chip with an active face upon which active circuitry and signal pads reside, and a back face opposite the active face; and
    pressing the second integrated circuit chip against the substrate such that the active face of the second integrated circuit chip is parallel to and adjacent to the active face of the substrate, and capacitive signal pads on the active face of the second integrated circuit chip overlap signal pads on the active face of the substrate.

3. The method of claim 2, further comprising pressing the first integrated circuit chip and the second integrated circuit chip against the substrate so that a signal pad on the active face of the substrate overlaps a signal pad on the active face of the first integrated circuit chip and also a signal pad on the active face of the second integrated circuit chip, thereby enabling the first integrated circuit chip to communicate with the second integrated circuit chip.

* * * * *